US011167288B2

United States Patent
Gach et al.

(10) Patent No.: US 11,167,288 B2
(45) Date of Patent: Nov. 9, 2021

(54) DIGITAL MICROFLUIDIC SYSTEMS AND METHODS FOR DROPLET MANIPULATION

(71) Applicant: National Technology & Engineering Solutions of Sandia, LLC, Albuquerque, NM (US)

(72) Inventors: Philip Gach, Kensington, CA (US); Manasi Raje, Emeryville, CA (US); Anup Singh, Danville, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 165 days.

(21) Appl. No.: 16/177,133

(22) Filed: Oct. 31, 2018

(65) Prior Publication Data

US 2019/0126279 A1 May 2, 2019

Related U.S. Application Data

(60) Provisional application No. 62/579,400, filed on Oct. 31, 2017.

(51) Int. Cl.
*B01L 3/00* (2006.01)

(52) U.S. Cl.
CPC ..... *B01L 3/502784* (2013.01); *B01L 3/50273* (2013.01); *B01L 3/502792* (2013.01); *B01L 3/502707* (2013.01); *B01L 3/502715* (2013.01); *B01L 2200/0673* (2013.01); *B01L 2300/0645* (2013.01); *B01L 2300/0816* (2013.01);
(Continued)

(58) Field of Classification Search
None
See application file for complete search history.

(56) References Cited

U.S. PATENT DOCUMENTS

| 8,981,789 B2 | 3/2015 | Hadwen |
| 2007/0023292 A1 | 2/2007 | Kim et al. |

(Continued)

FOREIGN PATENT DOCUMENTS

WO  2016/065365 A1  4/2016

OTHER PUBLICATIONS

Banerjee, A. et al. Programmable Electrowetting with Channels and Droplets, Micromachines 2015, 6, 172-185 (Year: 2015).*

*Primary Examiner* — Xiaoyun R Xu
(74) *Attorney, Agent, or Firm* — Kilpatrick Townsend & Stockton LLP

(57) ABSTRACT

The present disclosure relates to digital microfluidic systems. Particularly, aspects are directed to a digital microfluidic system that includes a droplet chip having a substrate, a plurality of electrodes and corresponding plurality of conducting vias or embedded conductive posts formed in the substrate, and a dielectric layer formed over the plurality of electrodes; and a control chip having a substrate, a plurality of transistors and corresponding wiring layers formed in the substrate, and a plurality of contacts formed over the plurality of transistors. Each of the plurality of contacts is electrically connected to a corresponding transistor of the plurality of transistors, and one or more of the plurality of contacts is removably connected to one or more of the plurality of conducting vias or embedded conductive posts such that one or more of the plurality of transistors are electrically connected to one or more of the plurality of electrodes.

16 Claims, 9 Drawing Sheets

(52) U.S. Cl.
CPC . *B01L 2300/0887* (2013.01); *B01L 2300/165* (2013.01); *B01L 2400/0427* (2013.01); *B81B 2201/05* (2013.01); *B81B 2203/04* (2013.01)

(56) References Cited

U.S. PATENT DOCUMENTS

2011/0247934 A1   10/2011  Wang et al.
2014/0152641 A1*  6/2014  Yun ........................ G09G 3/348
                                                                  345/212

* cited by examiner

DIGITAL MICROFLUIDIC SYSTEMS AND METHODS FOR DROPLET MANIPULATION

CROSS-REFERENCE TO RELATED APPLICATIONS

This application claims priority to U.S. Provisional Application No. 62/579,400 filed on Oct. 31, 2017, the entirety of which is incorporated herein by reference.

STATEMENT OF GOVERNMENT SUPPORT

The invention was made with government support under Contract No. DE-AC02-05CH11231 awarded by the U.S. Department of Energy. The government has certain rights in the invention.

FIELD OF THE INVENTION

The present disclosure relates to digital microfluidic devices, systems, and methods for droplet manipulation, and in particular to digital microfluidic systems having separate components including a droplet chip and a control chip that implement row-column addressing of droplet actuation electrodes, and methods for droplet manipulation using the separate components.

BACKGROUND

Digital microfluidics is a technology for microfluidic systems (e.g., lab-on-a-chip systems) based on the design, composition and manipulation of discrete droplets and/or bubbles. In digital microfluidic devices, electro-wetting-on-dielectric is a mechanism that may be used to dispense and manipulate droplets and/or bubbles. The electro-wetting-on-dielectric (EWOD) and dielectrophoresis (DEP) are mechanisms that exploit electromechanical forces to control the droplets and/or bubbles. For example, in digital microfluidic devices having the electro-wetting-on-dielectric mechanism, the droplets and/or bubbles are actuated under wettability differences between actuated and nonactuated electrodes in order to dispense, transport, split, and merge the droplets and/or bubbles. The digital microfluidic devices can be used together with analytical analysis procedures such as mass spectrometry, colorimetry, electrochemical, and electrochemiluminescense to perform one or more analytical assays on the droplets and/or bubbles, for example identify a target antigen within the droplets and/or bubbles.

Digital microfluidic devices having the electro-wetting-on-dielectric (EWOD) mechanism typically include a droplet transport layer and an electrode layer. The droplet transport layer comprises a hydrophobic material to decrease the surface energy where the droplets and/or bubbles are in contact with a surface of the droplet transport layer. The electrode layer is a two dimensional planar substrate (e.g., a substrate having depth/width and length) that includes droplet actuation electrodes routed to peripheral electrical connections on a same horizontal plane of the substrate. An applied voltage activates the droplet actuation electrodes and allows changes in the wettability of the droplets and/or bubbles on the surface of the droplet transport layer. In order to move the droplets and/or bubbles, a control voltage may applied to a droplet actuation electrode adjacent to a droplet and/or bubble, and at the same time, a droplet actuation electrode just under the droplet and/or bubble is deactivated. By varying the electric potential along a linear array of droplet actuation electrodes, electro-wetting can be used to move the droplets and/or bubbles along the linear array of droplet actuation electrodes. These digital microfluidic devices are typically application specific with individually addressable droplet actuation electrodes. This makes the fabrication of the digital microfluidic devices simpler but limits the number of droplet actuation electrodes that can be arrayed because it is impractical to fit a large number of electrical connections together with the droplet actuation electrodes in a two dimensional planar substrate.

To increase the throughput or the quantity of achievable electrodes, electrode arrays have been built by a three dimensional process such as complementary metal-oxide-semiconductor (CMOS) and thin-film transistor (TFT) where the electrode layer is a three dimensional planar substrate (e.g., a substrate having depth/width, length, and height) that includes droplet actuation electrodes routed to peripheral electrical connections within a vertical plane of the substrate (i.e., the droplet actuation electrodes and the peripheral electrical connections are on different horizontal planes). Although the three dimensional processes increase the throughput or the quantity of achievable electrodes, the three dimensional processes such as CMOS and the TFT are considerably more complex and expensive, and the small size of transistors that result from such processes is not optimal for typical droplet sizes used in digital microfluidic devices. Consequently, the three dimensional microfluidic devices are not well suited for the majority of microfluidic applications in which inexpensive, disposable single or limited use analytical assay devices are desired. Accordingly, the need exists for relatively inexpensive, disposable single or limited use digital microfluidic devices, systems, and methods that include or utilize an increased throughput or quantity of achievable electrodes.

BRIEF SUMMARY

In various embodiments, a digital microfluidic system is provided for that includes: a droplet chip including a first substrate, a plurality of electrodes and corresponding plurality of conducting vias or embedded conductive posts formed in the substrate, and a dielectric layer formed over the plurality of electrodes. The digital microfluidic system also includes a control chip including a second substrate, a plurality of transistors and corresponding wiring layers formed in the second substrate, and a plurality of contacts formed over the plurality of transistors. The digital microfluidic system also includes where each of the plurality of contacts is electrically connected to a terminal of a corresponding transistor of the plurality of transistors, and one or more of the plurality of contacts is removably connected to one or more of the plurality of conducting vias or embedded conductive posts such that one or more of the plurality of transistors are electrically connected to one or more of the plurality of electrodes.

Implementations may include one or more of the following features. The digital microfluidic system where: the first substrate, the plurality of electrodes and the corresponding plurality of conducting vias or embedded conductive posts, and the dielectric layer form a bottom plate of the droplet chip. The digital microfluidic system may also include the droplet chip further includes a top plate including a third substrate and a ground electrode formed on the third substrate. The digital microfluidic system may also include the top plate and the bottom plate are arranged in parallel to one another respectively with a distance gap maintained by one or more spacers making up one or more fluidic channels there between. The digital microfluidic system where the top plate further includes a first hydrophobic layer formed on the ground electrode, and the bottom plate further includes a second hydrophobic layer formed on the dielectric layer. The digital microfluidic system where each of the plurality of conducting vias or embedded conductive posts extends from a bottom surface of an electrode to a bottom surface of the first substrate. The digital microfluidic system where each of the plurality of vias is filled with a conductive material. The digital microfluidic system where each of the plurality of vias is lined with a conductive material but maintains a hole devoid of material through a center of the via. The digital microfluidic system where each of the plurality of transistors includes a source, drain, and gate, and the plurality of transistors are formed in a row-column fashion. The digital microfluidic system where the first substrate is a printed circuit board (PCB), a flexible circuit board, a glass substrate, a silicon substrate, a three dimensional printed substrate, a paper substrate, a polymer substrate, or any combination thereof. The digital microfluidic system where the plurality of transistors are included of an array of field effect transistors, an array of thin-film transistor devices, or an array of charge-coupled devices, and the second substrate further includes a logic device or control circuit to provide row-column addressing of the plurality of transistors.

One general aspect includes the digital microfluidic system where each gate of a transistor on a same axis is interconnected to form a row of transistors, and each drain of a transistor on a same axis is interconnected to form a column of transistors.

In various embodiments, a droplet chip is provided for that includes: a top plate including a first substrate and a ground electrode formed on the first substrate. The droplet chip also includes a bottom plate including a second substrate, a plurality of electrodes and corresponding plurality of conducting vias or embedded conductive posts formed in the second substrate, and a dielectric layer formed over the plurality of electrodes. The droplet chip also includes where the top plate and the bottom plate are arranged in parallel to one another respectively with a distance gap maintained by one or more spacers making up one or more fluidic channels there between. The droplet chip also includes where each of the plurality of conducting vias or embedded conductive posts extends from a bottom surface of an electrode to a bottom surface of the first substrate. The droplet chip also includes where each of the plurality of electrodes is configured to manipulate one or more droplets disposed in the one or more fluidic channels in response to an electrical voltage or current applied to at least one of the plurality of conducting vias or embedded conductive posts.

Implementations may include one or more of the following features. The droplet chip where the top plate further includes a first hydrophobic layer formed on the ground electrode, and the bottom plate further includes a second hydrophobic layer formed on the dielectric layer. The droplet chip where each of the plurality of vias is filled with a conductive material. The droplet chip where each of the plurality of vias is lined with a conductive material but maintains a hole devoid of material through a center of the via. The droplet chip where the second substrate is a printed circuit board (PCB), a flexible circuit board, a glass substrate, a silicon substrate, a three dimensional printed substrate, a paper substrate, a polymer substrate, or any combination thereof.

In various embodiments, a method of droplet manipulation is provided for that includes: obtaining a droplet chip including a first substrate, a plurality of electrodes and corresponding plurality of conducting vias or embedded conductive posts formed in the substrate, and a dielectric layer formed over the plurality of electrodes. The method of droplet manipulation also includes obtaining a control chip including a second substrate, a plurality of transistors and corresponding wiring layers formed in the second substrate, and a plurality of contacts formed over the plurality of transistors. The method of droplet manipulation also includes removably connecting the control chip with the droplet chip, where each of the plurality of contacts is electrically connected to a terminal of a corresponding transistor of the plurality of transistors, and one or more of the plurality of contacts is removably connected to one or more of the plurality of conducting vias or embedded conductive posts such that one or more of the plurality of transistors are electrically connected to one or more of the plurality of electrodes. The method of droplet manipulation also includes applying an electrical voltage or current to one or more of the plurality of transistors to actuate one or more corresponding electrodes of the plurality of electrodes, which allows changes in wettability of a droplet on or within the droplet chip.

Implementations may include one or more of the following features. The method where: the first substrate, the plurality of electrodes and the corresponding plurality of conducting vias or embedded conductive posts, and the dielectric layer form a bottom plate of the droplet chip. The method may also include the droplet chip further includes a top plate including a third substrate and a ground electrode formed on the third substrate. The method may also include the top plate and the bottom plate are arranged in parallel to one another respectively with a distance gap maintained by one or more spacers making up one or more fluidic channels there between. The method may also include the droplet is within the one or more fluidic channels. The method where each of the plurality of transistors includes a source, drain, and gate, and the plurality of transistors are formed in a row-column fashion. The method where: each gate of a transistor on a same axis is interconnected to form a row of transistors. The method may also include each drain of a transistor on a same axis is interconnected to form a column of transistors. The method may also include applying an electrical voltage or current to one or more of the plurality of transistors includes applying the electrical voltage or current to a terminal of the one or more of the plurality of transistors. The method where: the first substrate is a printed circuit board (PCB), a flexible circuit board, a glass substrate, a silicon substrate, a three dimensional printed substrate, a paper substrate, or any combination thereof. The method may also include the plurality of transistors are included of an array of field effect transistors, an array of thin-film transistor devices, or an array of charge-coupled devices. The method may also include the second substrate further includes a logic device or control circuit to provide row-column addressing of the plurality of transistors.

BRIEF DESCRIPTION OF THE DRAWINGS

The present invention will be better understood in view of the following non-limiting figures, in which.

DETAILED DESCRIPTION

I. Introduction

Figure 1:
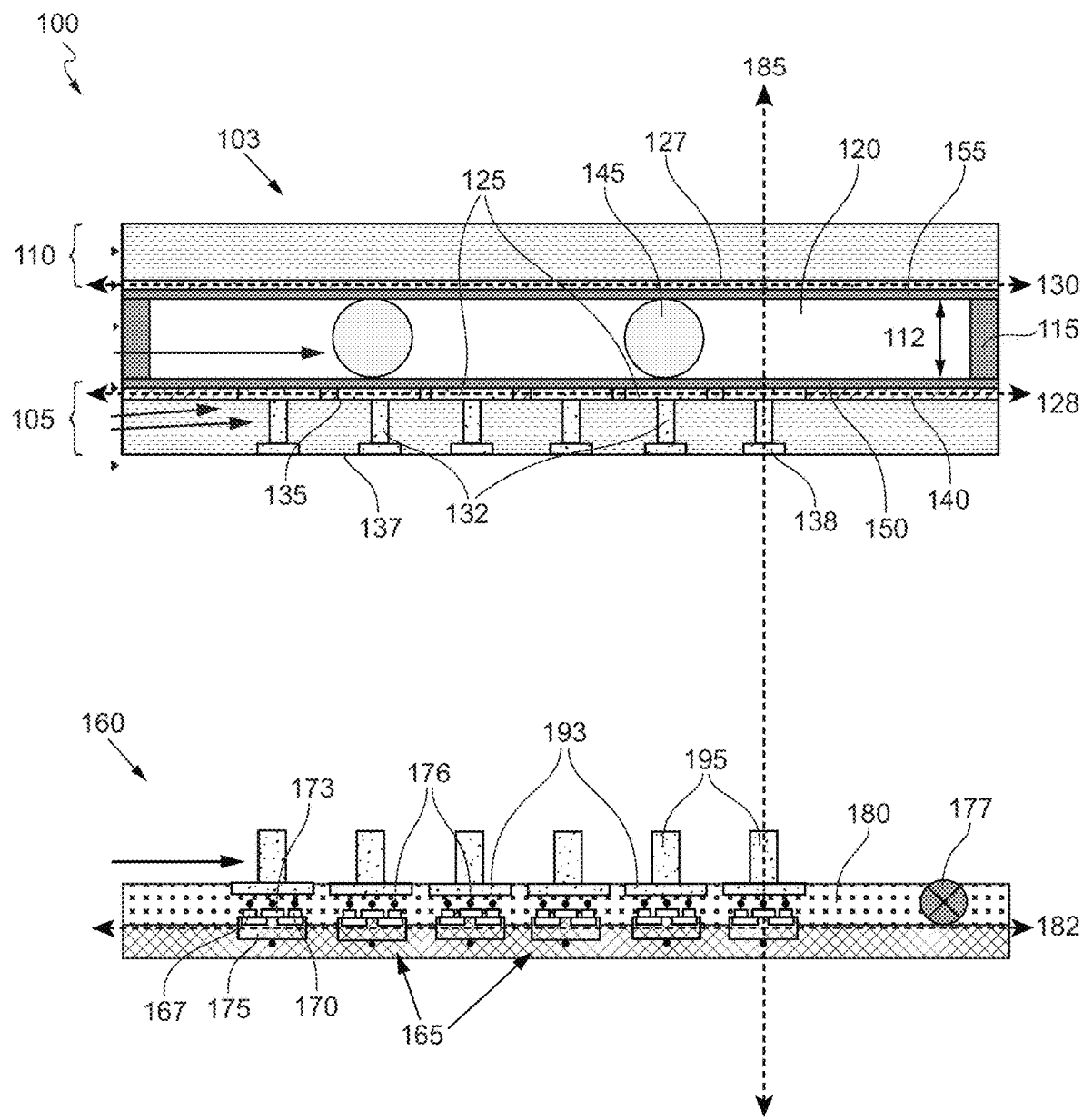
FIG. 1 shows a digital microfluidic system in accordance with various embodiments.

The following disclosure describes digital microfluidic systems having separate components including a droplet chip and a control chip that implement row-column addressing of droplet actuation electrodes, and methods for droplet manipulation using the separate component. In some embodiments, a two-plate "closed" digital microfluidic system is provided for that includes a droplet chip comprising: (i) a first plate comprising a continuous electrode disposed within a first substrate covered by a first hydrophobic layer, and (ii) a second plate comprising an array of droplet actuation electrodes disposed within a second substrate covered by a dielectric layer and a second hydrophobic layer. Problems associated with conventional digital microfluidic systems, however, may include: (i) a limited number of droplet actuation electrodes that can be arrayed; (ii) small size transistors that are not optimal for typical droplet sizes used in digital microfluidic devices; and/or (iii) complex and expensive fabrication processes that are not well suited for the majority of microfluidic applications in which inexpensive, disposable single or limited use analytical assay devices are desired. These conventional digital microfluidic systems may be unable to assume greater design complexity with increased throughput or quantity of achievable electrodes while remaining relatively inexpensive such that the devices can be disposable or adequate for limited use.

In view of these problems, various embodiments disclosed herein divide the digital microfluidic systems and fabrication complexity into two separate components: (i) the droplet chip comprising the array of droplet actuation electrodes, dielectric, hydrophobic layers, and fluidic channels, and (ii) a control chip comprising an array of transistors and corresponding wiring. The droplet chip is intended to be disposable or adequate for limited use, and the control chip is a reusable integrated circuit chip. The droplet chip and the control chip may be connected reversibly so that the control chip remains independent of the microfluidic application, and thus can be reused with a subsequent droplet chip(s). The droplet chip(s) may be fabricated and customized for specific application(s), using a variety of substrates (e.g., glass, organic or inorganic polymers, printed circuit boards (PCBs), paper, etc.) and processes (e.g., three dimensional (3D) printing, electrode printing on a substrate, photolithography, etc.). The control chip may be fabricated using one or more three dimensional fabrication processes used to form CMOS field effect transistors (FET) arrays, TFT device arrays, or charge-coupled device (CCD) arrays. For example, one or more illustrative embodiments of a digital microfluidic system may include a droplet chip having a substrate, a plurality of electrodes and corresponding plurality of conducting vias or embedded conductive posts formed in the substrate, and a dielectric layer formed over the plurality of electrodes; and a control chip having a substrate, a plurality of transistors and corresponding wiring layers formed in the substrate, and a plurality of contacts formed over the plurality of transistors. Each of the plurality of contacts is electrically connected to a corresponding transistor of the plurality of transistors, and one or more of the plurality of contacts is removably connected to one or more of the plurality of conducting vias or embedded conductive posts such that one or more of the plurality of transistors are electrically connected to one or more of the plurality of electrodes.

Advantageously, the packaging format of the digital microfluidic systems (i.e., dividing the digital microfluidic systems and fabrication complexity into two separate components) in accordance with aspects discussed herein provides multiple benefits over conventional digital microfluidic systems including: (i) a highly programmable system having a low-cost and disposable droplet chip and a reusable integrated circuit control chip, and (ii) low (10s) to moderate (100s) to very high-density (10,000-100,000s) electrode arrays that can be operated in row-column mode in a similar manner to integrated circuit arrays (e.g., TFT arrays, or charge-coupled device (CCD) arrays). Specifically, these approaches can provide relatively inexpensive, disposable single or limited use digital microfluidic devices, systems, and methods that include or utilize an increased throughput or quantity of achievable electrodes.

II. Digital Microfluidic Devices and Systems with Variable Electrode Array

FIG. 1 shows a digital microfluidic system 100 in accordance with various aspects of the present invention. In some embodiments, the digital microfluidic system 100 includes a droplet chip 103 comprising two plates 105 and 110 (i.e., a bottom plate and a top plate for a closed system) arranged in parallel to one another respectively with a distance gap 112 (e.g., maintained by one or more spacers 115) making up one or more fluidic channels 120. In other embodiments, the digital microfluidic system 100 includes only one plate 105 (i.e., only a bottom plate for an open system). The bottom plate 105 and the top plate 110 may be made of the same or different material such as glass or silicon. In certain embodiments, the bottom plate 105 is a printed circuit board (PCB), a flexible circuit board, a glass substrate, a silicon substrate, a three dimensional printed substrate, a paper substrate, or any combination thereof. The bottom plate 105 may comprise a patterned array of individually controllable electrodes 125 (droplet actuation electrodes), and the top plate 110 may comprise a continuous ground electrode 127. The electrodes (e.g., electrodes 125 and/or the continuous ground electrode 127) may be formed of any material, such as copper, graphite, titanium, brass, silver, platinum, indium tin oxide (ITO), and any alloys thereof, that has the combined features of electrical conductivity, corrosion resistance, hardness, form, size, and optionally optical transparency. In certain embodiments, the array of electrodes 125 are provided on a same horizontal plane 128 of the bottom plate 105, and the continuous ground electrode 127 is provided on a same horizontal plane 130 of the top plate 110.

In various embodiments, the bottom plate 105 further includes at least one contact via 132 in contact with each of the electrodes 125. In some embodiments, each contact via 132 may extend from a surface of the each electrode 125 to a surface of the bottom plate 105 such that each electrode 125 is exposed to an environment external to the bottom plate 105. For example, each contact via 132 may extend from a bottom surface 135 of each electrode 125 through the bottom plate 105 to a bottom surface 137 of the bottom plate 105. In such embodiments, each contact via 132 is devoid of material (optionally each via 132 may be lined with a conductive material but maintains a hole devoid of material through the center of the via 132) and is configured to receive a corresponding conductive pin from a control chip. In other embodiments, each contact via 132 may extend from a surface of the each electrode 125 to a surface of a contact electrode (optional shown as 138) or contact pad disposed within the bottom plate 105. For example, each contact via 132 may extend from a bottom surface 135 of each electrode 125 through the bottom plate 105 to a contact electrode or contact pad (optional shown as 138) disposed at the bottom surface 135 of the bottom plate 105. In such alternative embodiments, each contact via 132 is filled with a conductive material (does not have a hole devoid of material through the center of the via 132) and is configured to provide an electrical connection between the electrodes 125 and the corresponding contact electrodes or contact pads (optional shown as 138), which in turn may be electrically interfaced with corresponding contacts of a control chip. Each contact via 132 provides an electrical connection between its respective electrode 125 and control circuitry (e.g., logic device or control circuitry within a control chip) so that each electrode 125 can be directly and independently electrically actuated through the via 132. Consequently, in response to an electric voltage or current applied through the via 132, a surface wettability of the driving surface in the vicinity of the actuated electrode 125 is modified. By properly actuating the electrodes 125, one or more droplets may be manipulated (serially or simultaneously) by the digital microfluidic system 100 as required for the process being performed by the digital microfluidic system 100. For example, droplets may be created from a reservoir, moved, divided, and/or combined/mixed, as desired.

The bottom plate 105 may further include a dielectric layer 140 made of a dielectric material such as parylene C, parylene AF4, polyimide, polytetrafluoroethylene (PTFE), polydimethylsiloxane (PDMS), SU-8 photoresist, silicon dioxide, or silicon nitride. If the material of the dielectric layer 140 exhibits suitable hydrophobic properties for EWOD, then the dielectric layer 140 may be utilized as the driving surface of the digital microfluidic system 100. In other words, when the electric voltage or current is applied to one or more of the electrodes 125, the surface wettability of the dielectric layer 140 will become less hydrophobic (or will change from hydrophobic to hydrophilic, or will become more hydrophilic, as the case may be). As a result, a droplet and/or bubble 145, or portions thereof, in the vicinity of the actuated electrodes 125 will tend to be pulled toward the actuated electrodes 125. For example, parylene C is hydrophobic and can be utilized as the driving surface. The droplet and/or bubble 145 may comprise a sample (e.g., a biochemical, chemical, biological, etc. sample) and optionally a filler medium, such as silicone oil or air, and may be sandwiched between the bottom plate 105 and the top plate 110 to facilitate the transportation of the droplet inside the one or more fluidic channels 120.

If the dielectric layer 140 is not suitable for efficient electric operations, or in the instance that a better driving surface is desired, a hydrophobic layer 150 may be disposed on the dielectric layer 140 in order to improve the operational characteristics of the surface of the bottom plate 105. In certain embodiments, a hydrophobic layer 155 may additionally or alternatively be disposed on the continuous ground electrode 127 of the top plate 110 in order to improve the operational characteristics of the surface the top plate 110. Suitable materials for the hydrophobic layers 150 and 155 include Teflon™ AF, Cytop®, Rain-X®, Aquapel® super hydrophobic nanostructures, and other hydrophobic materials. The hydrophobic layers 150 and 155 can be applied onto a surface of the dielectric layer 140 and/or the continuous ground electrode 127 by any suitable method, such as spin coating, or other deposition methods as known in the art. The hydrophobic layers 150 and 155 may be added to the bottom plate 105 and/or the top plate 110 to provide a low friction against droplet movement or increase the wettability of the driving surface of each plate, and to add capacitance between the droplet and/or bubble 145 and the electrodes 125. As such, other low-friction materials can substitute the hydrophobic material.

In various embodiments, the digital microfluidic system 100 further includes a control chip 160 comprising an array of transistors 165 (e.g., FETs). The array of transistors 165 may be fabricated using one or more three dimensional fabrication processes used to form CMOS FET arrays, TFT arrays, or CCD arrays. Commercially-available transistors (e.g., TIP120, BSP89, etc.) may also be used as elements of the array. Each of the transistors 165 comprises a source 167, a drain 170, a gate 173, and a body (or the substrate) 175. The terminals 176 (i.e., terminals of the source 167, the drain 170, the gate 173, and body 175) of each transistor 165 may be interfaced to driving circuitry 177 by adding wiring layers or conductive connections 180 appropriately. The driving circuitry 177 may include a logic device or control circuitry and multiplexers connected to "n" rows and "m" columns of transistors 165 to permit row-column operation of the transistors 165. The driving circuitry may further include feedback circuitry to "detect" the presence of a droplet on top of an electrode by measuring a change in electrical impedance in between the bottom plate 105 and the top plate 110 caused by presence of droplet of interest as opposed to only media present in between the two plates. The feedback information for detection of droplet may be useful to optimize the droplet movement protocol as well as for satisfying user defined experimental requirements. In certain embodiments, the array of transistors 165 are provided on a same horizontal plane 182 of the control chip 160. Each of the transistors 165 can be provided within a same vertical plane 185 as corresponding electrodes within the array of electrodes 125 such that the digital microfluidic system 100 is three dimensional (e.g., a system having depth/width, length, and height) that includes droplet actuation electrodes routed to peripheral electrical connections or transistors within a vertical plane of the system (i.e., the droplet actuation electrodes and the peripheral electrical connections or transistors are on different horizontal planes).

In some embodiments, each source 167 is individually connected to a metal "pixel", which acts as an electrode connector 193. Each electrode connector 193 is connectable to an electrode 125 directly through a corresponding contact via 132, thus establishing the access required to activate the electrodes 125 on the droplet chip 103. This connection between the droplet chip 103 and the control chip 160 is reversible since no hard-wired connections are fabricated. Such flexibility allows a single transistor array to be used for hundreds of experiments while the droplet chip 103 can be disposed of after each or a few experiments. Additionally, more than one design of droplet chip 103 (e.g., an electrode array of 10s of electrodes or an electrode arrays of 100s or 1000s of electrodes) can be plugged onto the control chip 160 as per application requirement.

In various embodiments, the droplet chip 103 is directly connectable with the control chip 160. Consequently, as a voltage or current may be applied through one or more transistors 165 of the control chip 160, the voltage or current is routed through the substrate of the bottom plate 105 to the corresponding electrode 125 of the droplet chip 103. In some embodiments, the droplet chip 103 may comprise a plurality of contact electrodes or contact pads 138 and a plurality of corresponding contact vias 132 (filled in with a conductive material) for interfacing with a plurality of corresponding electrode connectors 193 on the control chip 160. Each electrode 125, contact via 132, and contact electrode or contact pad 138 are connected (optionally vertically aligned and connected) and each transistor 165 and electrode connector 193 are connected (optionally vertically aligned and connected) such that each electrode 125 can be directly connected to a corresponding transistor 165 when the droplet chip 103 is brought into direct contact with the control chip 160. In other embodiments, the droplet chip 103 may comprise a plurality of contact vias 132 (not filled in and optionally lined with a conductive material) for interfacing with a plurality of corresponding pins 195 and electrode connectors 193 on the control chip 160. Each electrode 125 and contact via 132 are connected (optionally vertically aligned and connected) and each transistor 165, electrode connector 193, and pin 195 are connected (optionally vertically aligned and connected) such that each electrode 125 can be directly connected to a corresponding transistor 165 when the droplet chip 103 is brought into direct contact with the control chip 160.

Although two specific methods of packaging and connection (pads or pins) are discussed herein, it should be understood that the droplet chip 103 and the control chip 160 may be packaged and connected via many different methods without departing from the spirit and scope of the disclosed invention. For example, the droplet chip 103 and the control chip 160 can be interfaced by a variety of packaging technologies including but not limited to flip-chip assembly, 3D printed vertical conductive posts, land grid array (LGA), and pogo pin assembly. The scale and configuration of the control chip 160 would determine the type of packaging technology that will be used to interface the two chips. Flexible substrates for the droplet chip 103 including flex circuits, paper and some 3D printed materials, may be directly interfaced with the control chip 160. In certain embodiments, the flexible substrates may also be patterned with a removable adhesive to aid circuit attachment.

Connection between the droplet chip 103 and control chip 160 may also be established by using a sheet of random metal particles embedded in a non-conducting material. The sheet can be sandwiched between the droplet chip 103 and control chip 160, and compressed slightly to establish electrical connection. The metal particles in the sheet come in contact with the electrodes on top and control pads on bottom, and thus form a connection between the parts falling in the same z-axis. The minimum pitch and particle size may be selected to maintain that there is no shorting of electrodes and ensures that all electrodes are connected to the control pads that fall right beneath them without any precise alignment required. Advantageously, using these sheets for connections eliminates electrical connection(s) in any plane other than z-plane. The sheets (e.g., sheets manufactured via Shin-Etsu Japan (AF-type Inter-Connector) or Samtec (High-Speed Dual Compression Array) may be composed of anisotropic sheets of silicon rubber with carbon fibers in the Z-axis and available at desired dimensions and particle sizes to connect electrodes with a spacing of more than 20 µm. The spacing may be maintained in the designs to work with the high number of electrodes and micro-volumes of droplets.

Figure 2:
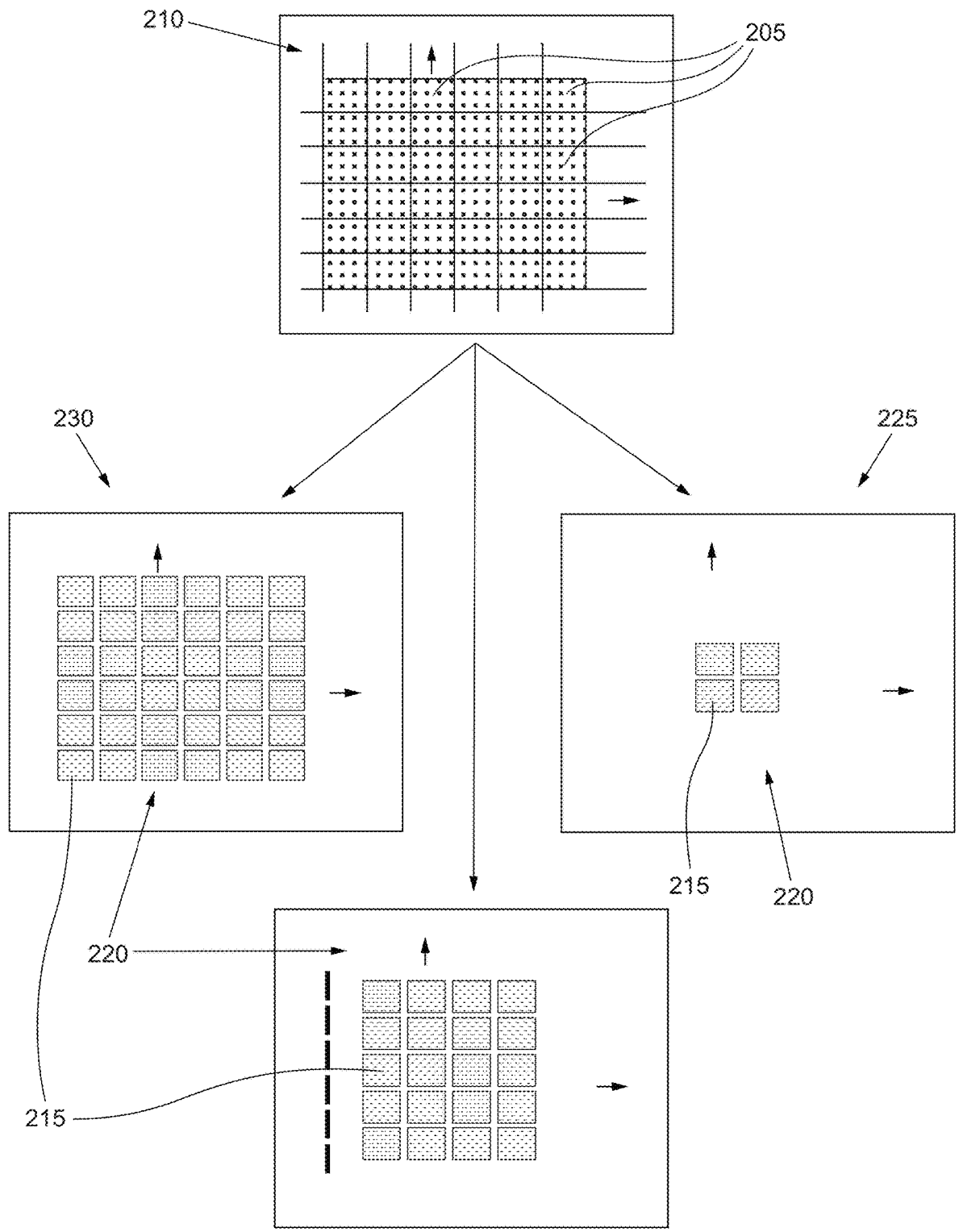
FIG. 2 shows a transistor array and variable electrode array in accordance with various embodiments.
Figure 3:
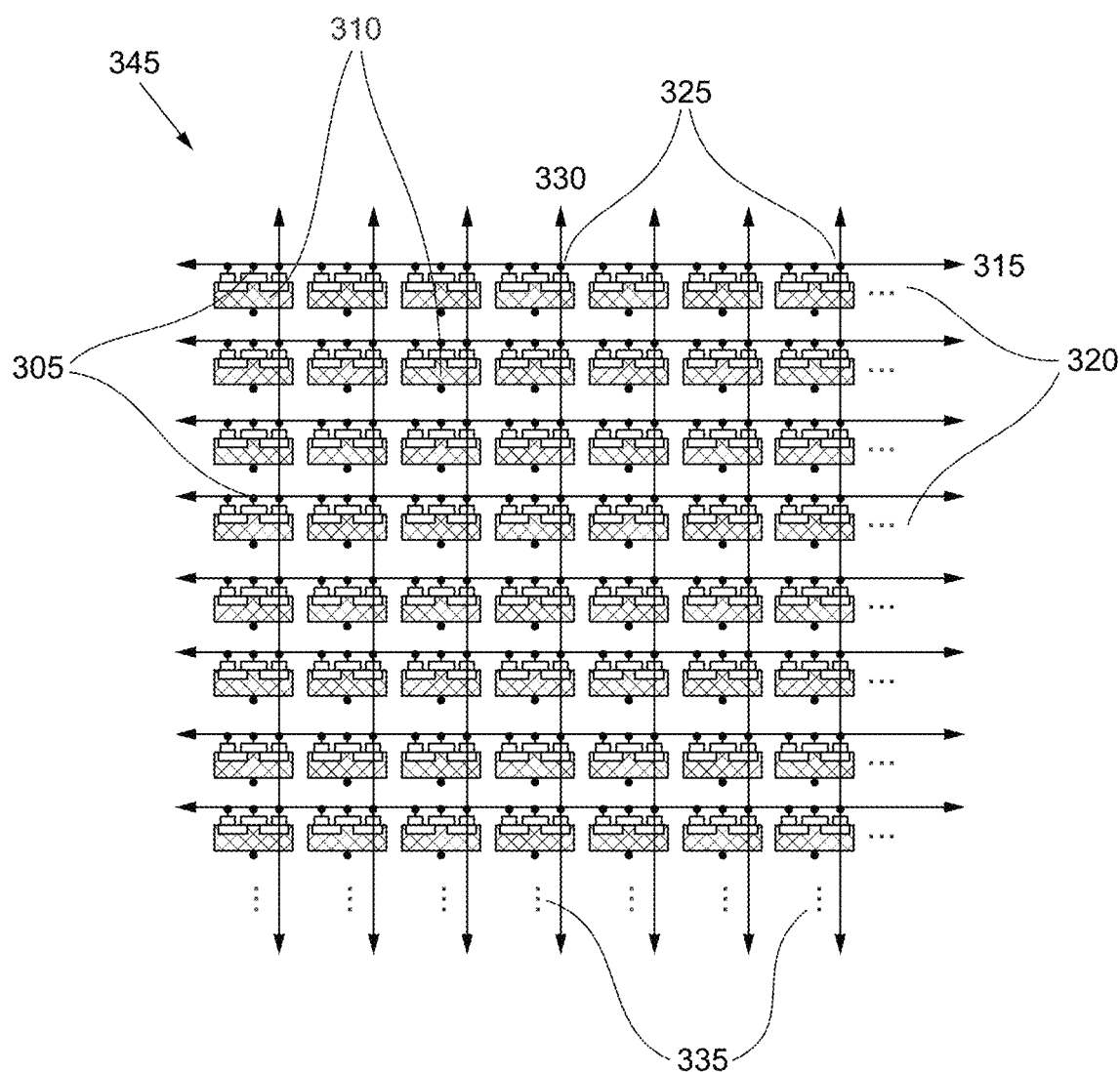
FIG. 3 shows a transistor array in accordance with various embodiments.

FIG. 2 shows an array of transistors 205 on a control chip 210 may be fabricated in a row-column fashion to aid scalability in the number of electrodes 215 (e.g., provides variability in the number of electrodes that can be used to perform one or more analytical tests on the droplet chip) implemented in the droplet chip 220. Scalability is an aspect of the present invention that is targeted towards achieving a low-density array as well as a high-density array (increased throughput or quantity of achievable electrodes) for a digital microfluidic system. For low-density arrays 225, it is possible to address each electrode 215 individually; however for high-density arrays 230 the individual addressing of each electrode 215 becomes impractical. In order to solve this problem, certain embodiments are directed to arranging the electrodes with row-column addressing. Specifically, as shown in FIG. 3, each gate 305 of a transistor 310 on a same axis 315 may be interconnected to form "n" rows 325 and each drain 330 of a transistor 310 on a same axis 335 may be interconnected to form "m" columns 340, resulting in an "n"×"m" row-column circuit 345. In the row-column addressing scheme, each electrode 215 is defined by the overlap of a transistor 205 is a specific row and column. Thus, a droplet chip 220 that has "n"×"m" electrodes 215 needs only "n"×"m" transistors 205. In some embodiments, all the transistors 205 in a row or column see a common voltage.

III. Methods For Fabricating Digital Microfluidic Devices and Systems

FIGS. 4A-4H and 5A-5C show structures and respective processing steps for fabricating a digital microfluidic system 400 (e.g., as described with respect to FIGS. 1, 2, and 3) in accordance with various aspects of the invention. It should be understood by those of skill in the art that the digital microfluidic system can be manufactured in a number of ways using a number of different tools. In general, however, the methodologies and tools used to form the structures of the various embodiments can be adopted from integrated circuit (IC) technology. For example, the structures of the various embodiments, e.g., electrodes, wiring layers, vias, bond/contact pads, etc., may be built on a substrate and realized in films of materials patterned by photolithographic processes. In particular, the fabrication of various structures described herein may typically use three basic building blocks: (i) deposition of films of material on a substrate and/or previous film(s), (ii) applying a patterned mask on top of the film(s) by photolithographic imaging, and (iii) etching the film(s) selectively to the mask.

As used herein, the term "depositing" may include any known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating (e.g., electroplating), or evaporation.

As used herein, the term "etching" may include any known or later developed techniques appropriate for the material to be etched including but not limited to, for example: machine drilling, chemical etching, particle blasting, laser drilling, wet etching, dry etching, and plasma etching.

Figure 4A:
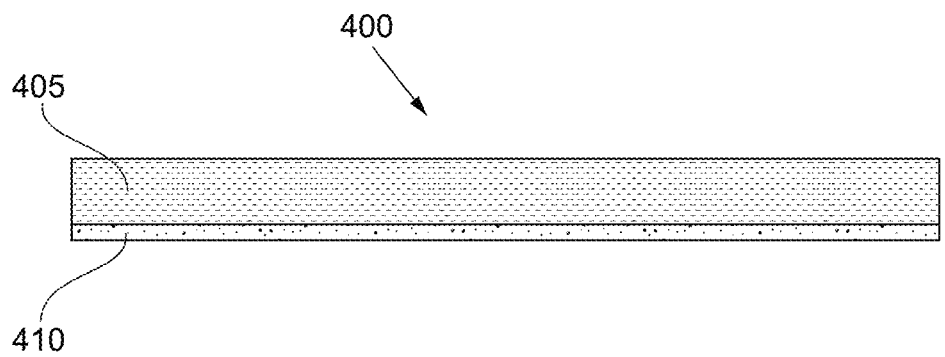
FIGS. 4A-4H show cross-sectional side views illustrating a method of fabricating a digital microfluidic system in accordance with various embodiments.

FIG. 4A shows a top plate 400 comprising a substrate 405 and a continuous ground electrode 410. The substrate 405 may be glass, organic or inorganic polymers (e.g., liquid crystal polymers or polyimide), SU-8 photoresist, polydimethylsiloxane (PDMS), polyethylene terephthalate (PET), poly(methyl methacrylate) (PMMA), polystyrene (PS), Cyclic Olefin Copolymer (COC)), printed circuit boards (PCBs), paper, flexible circuit substrate, 3D printed substrates, etc. The substrate 405 may be thinned to a desired thickness by planarization, grinding, etching, oxidation followed by oxide etch, or any combination thereof. This process can be repeated to achieve a desired thickness for the substrate 405. In some embodiments, the substrate 405 may have a thickness from 1.0 µm to 100 µm. In other embodiments, the substrate 405 may have a thickness from 100 µm to 1.0 cm. The continuous ground electrode 410 may be formed over at least a portion of the substrate 405. In some embodiments, forming the continuous ground electrode 410 may include using conventional processes. For example, a conductive material may be blanket deposited on the substrate 405. The conductive material may be chromium (Cr), copper (Cu), gold (Au), silver (Ag), titanium (Ti), or platinum (Pt), or alloys thereof such as gold/chromium (Au/Cr) indium tin oxide (ITO) or Titanium/Platinum (Ti/Pt), or conductive polymers Poly(2,3-dihydrothieno-1,4-dioxin)-poly(styrenesulfonate) (PEDOT:PSS), for example. Once the conductive material is deposited, the conductive material may be patterned using conventional lithography and etching processes to form the continuous ground electrode 410 as shown in FIG. 8A, for example.

Figure 4B:
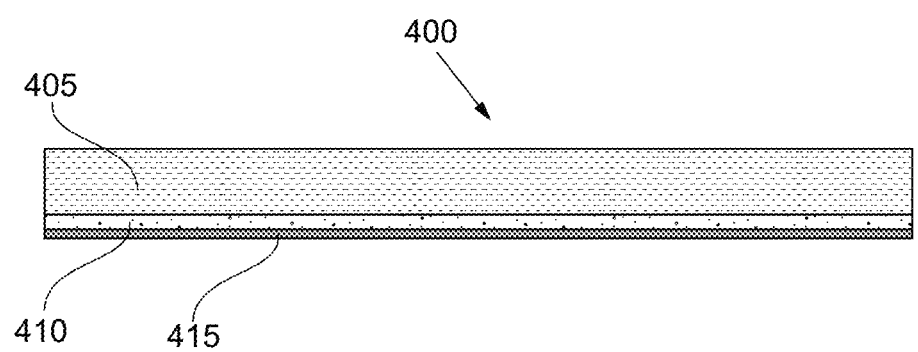

FIG. 4B shows a top plate 400 comprising a substrate 405, a continuous ground electrode 410, and a hydrophobic layer 415. The hydrophobic layer 415 may be formed over at least a portion of the continuous ground electrode 410. In some embodiments, forming the hydrophobic layer 415 may include using conventional processes. For example, a hydrophobic material may be blanket deposited on the continuous ground electrode 410. The hydrophobic material may be Teflon™ AF, Cytop®, or parylene AF4 for example. Once the hydrophobic material is deposited, the hydrophobic material may be patterned using conventional lithography and etching processes to form the hydrophobic layer 415 as shown in FIG. 8B, for example.

Figure 4C:
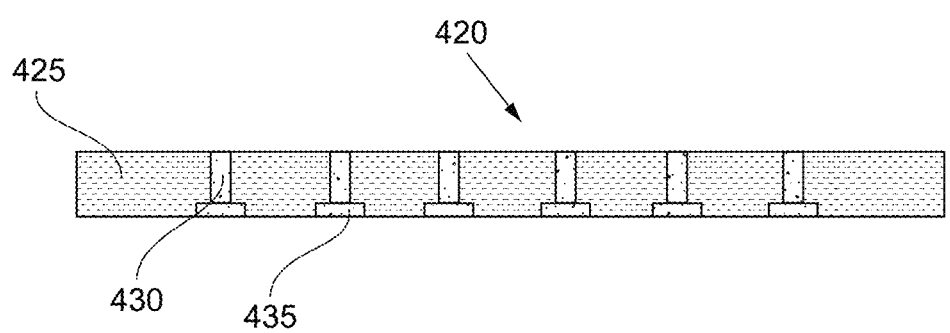

FIG. 4C shows a bottom plate 420 comprising a substrate 425 and one or more contact vias 430 (e.g., a plurality of conducting vias or embedded conductive posts). The substrate 425 may be glass, organic or inorganic polymers (e.g., liquid crystal polymers or polyimide), printed circuit boards (PCBs), paper, etc. The substrate 425 may be thinned to a desired thickness by planarization, grinding, etching, oxidation followed by oxide etch, or any combination thereof. This process can be repeated to achieve a desired thickness for the substrate 425. In some embodiments, the substrate 425 may have a thickness from 1.0 µm to 24.0 µm. In other embodiments, the substrate 425 may have a thickness from 25.0 µm to 1.0 cm. The contact vias 430 may be formed in the substrate 425 to the bottom surface of the substrate 425. The contact vias 430 can be formed using conventional lithographic, etching, and cleaning processes, known to those of skill in the art.

Figure 4D:
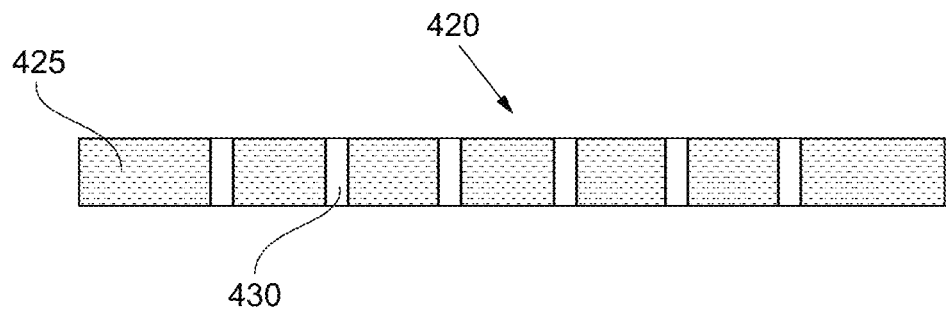

For example, in some embodiments, a trench can be etched into the substrate 425 and a conductive material may be deposited into the trench. The conductive material may be chromium (Cr), copper (Cu), gold (Au), silver (Ag), titanium (Ti), or platinum (Pt), or alloys thereof such as gold/chromium (Au/Cr), indium tin oxide (ITO) or Titanium/Platinum (Ti/Pt), or graphene, for example. Once the conductive material is deposited, the conductive material may be planarized using conventional processes such as chemical mechanical planarization (CMP) to form the contact vias 430 as shown in FIG. 4C, for example. As shown, in some embodiments, the contact vias 430 may be formed in contact with a contact electrode 435, which may be formed using similar lithographic, etching, and cleaning processes, known to those of skill in the art. In other embodiments, a trench can be etched into the substrate 425, and optionally a conductive material may be deposited onto sides of the trench to line the vias 430 with a conductive material. The conductive material may be chromium (Cr), copper (Cu), gold (Au), silver (Ag), titanium (Ti), or platinum (Pt), or alloys thereof such as gold/chromium (Au/Cr), indium tin oxide (ITO) or Titanium/Platinum (Ti/Pt), or graphene, for example. Once the conductive material is deposited, the conductive material may be planarized using conventional processes such as CMP to form the contact vias 430 as shown in FIG. 4D.

Figure 4E:
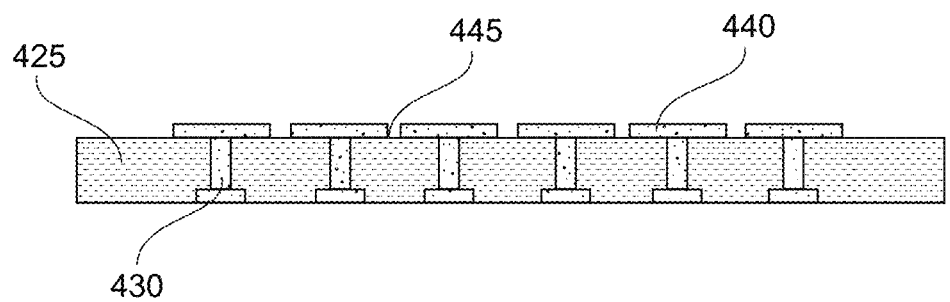

FIG. 4E shows electrodes 440 formed on the substrate 425 and within contact with the vias 430. In various embodiments, the electrodes 440 may be formed using conventional processes. For example, a conductive material may be blanket deposited on the substrate 425, including within contact with the vias 430. The conductive material may be chromium (Cr), copper (Cu), gold (Au), silver (Ag), titanium (Ti), or platinum (Pt), or alloys thereof such as gold/chromium (Au/Cr), indium tin oxide (ITO) or Titanium/Platinum (Ti/Pt), or graphene, for example. Once the conductive material is deposited, the conductive material may be patterned using conventional lithography and etching processes to form at least one electrode 440 or a pattern of electrodes 440 as shown in FIG. 4E, for example. In some embodiments, the pattern of electrodes 440 may include each electrode 440 spaced apart from one another via a portion or region 445 of the substrate 425. It should be understood by those of skill in the art that different patterns are also contemplated by the present invention.

Figure 4F:
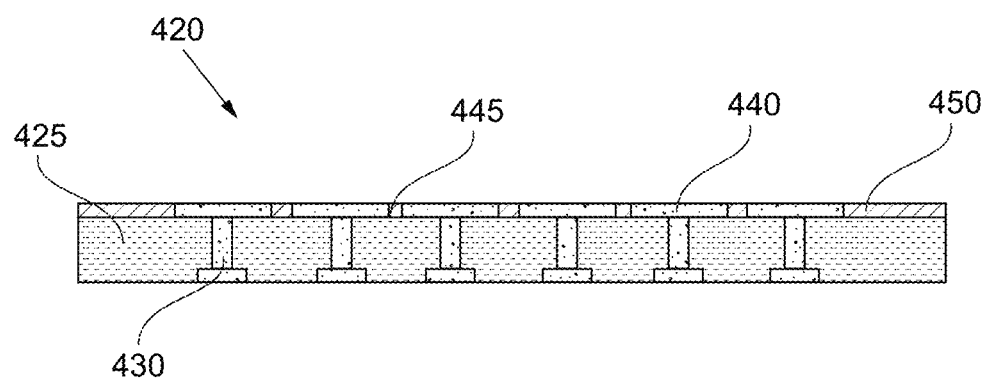

FIG. 4F shows a bottom plate 420 comprising a substrate 425, vias, 430, electrodes 440, and a dielectric layer 450. The dielectric layer 450 may be formed over at least a portion of the substrate 425 and/or electrodes 440. In some embodiments, forming the dielectric layer 450 may include using conventional processes. For example, a dielectric material may be blanket deposited on the substrate 425 and/or electrodes 440. The dielectric material may be parylene C, silicon dioxide, silicon nitride, photopolymers, polylactic acid, or acrylonitrile butadiene styrene, for example. Once the dielectric material is deposited, the dielectric material may be patterned using conventional lithography and etching processes to form the dielectric layer 450 as shown in FIG. 4F, for example.

Figure 4G:
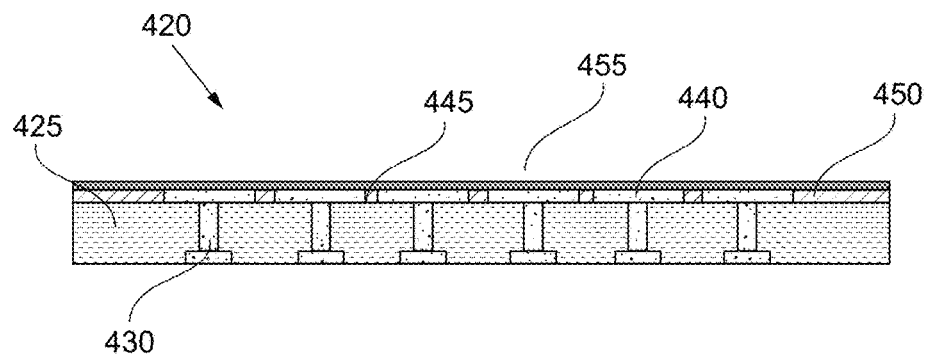

Optionally, FIG. 4G shows a bottom plate 420 comprising a substrate 425, vias, 430, electrodes 440, a dielectric layer 450, and a hydrophobic layer 455. The hydrophobic layer 455 may be formed over at least a portion of the dielectric layer 450. In some embodiments, forming the hydrophobic layer 455 may include using conventional processes. For example, a hydrophobic material may be blanket deposited on the dielectric layer 450. The hydrophobic material may be Teflon™ AF, Cytop®, or parylene AF4 for example. Once the hydrophobic material is deposited, the hydrophobic material may be patterned using conventional lithography and etching processes to form the hydrophobic layer 455 as shown in FIG. 4F, for example.

Figure 4H:
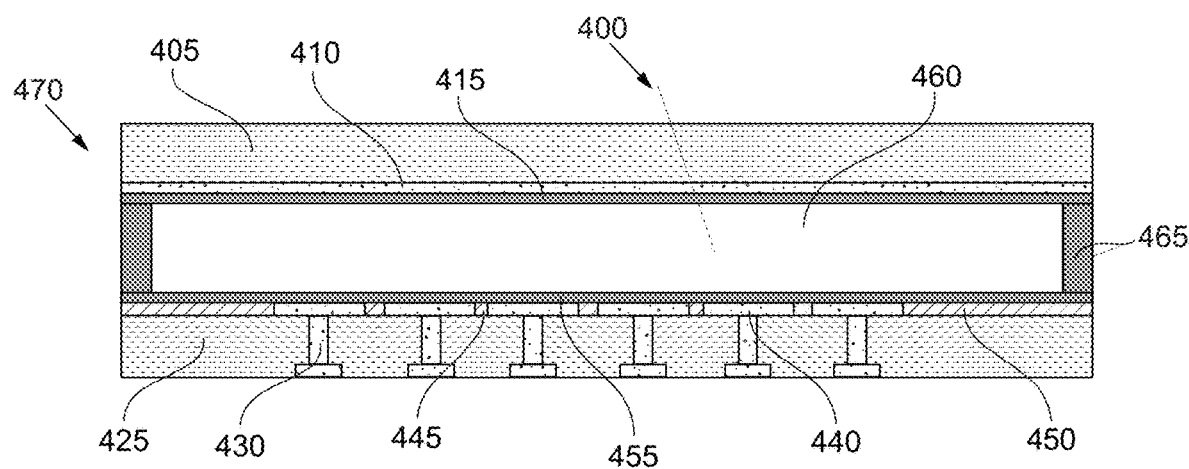

Following formation of the top plate 400 and the bottom plate 420, a one or more conduits 460 may be formed between the top plate 400 and the bottom plate 420. In various embodiments, spacers 465 may be deposited on the bottom plate 420 to create the one or more conduits 460. In some embodiments, forming the spacers 465 may include using conventional processes. For example, a spacer material may be blanket deposited on the top plate 420. The spacer material may be polymers, glass, tape, including SU-8 photoresist, polydimethylsiloxane (PDMS), polyethylene terephthalate (PET), poly(methyl methacrylate) (PMMA), polystyrene (PS), Cyclic Olefin Copolymer (COC), for example. Once the spacer material is deposited or molded, the spacer material may be patterned using conventional lithography and etching processes to form the spacers 460 as shown in FIG. 4H, for example. Thereafter, the top plate 400 can be joined with the bottom plate 425 via the spacers 465. In various embodiments, the join including laying the top plate 400 over the bottom plate 425 on the spacers 465 and connecting the top plate 400 to the top surfaces of the spacers 465. The connecting may be accomplished using any conventional method such as the use of a permanent or temporary adhesive layer between the top layer 400 and the spacers 465. The connection of the top plate 400 to the bottom plate 425 results in the final product of a droplet chip 470. In accordance with various aspects discussed herein, the a droplet chip 470 is intended to be disposable or adequate for limited use.

Figure 5A:
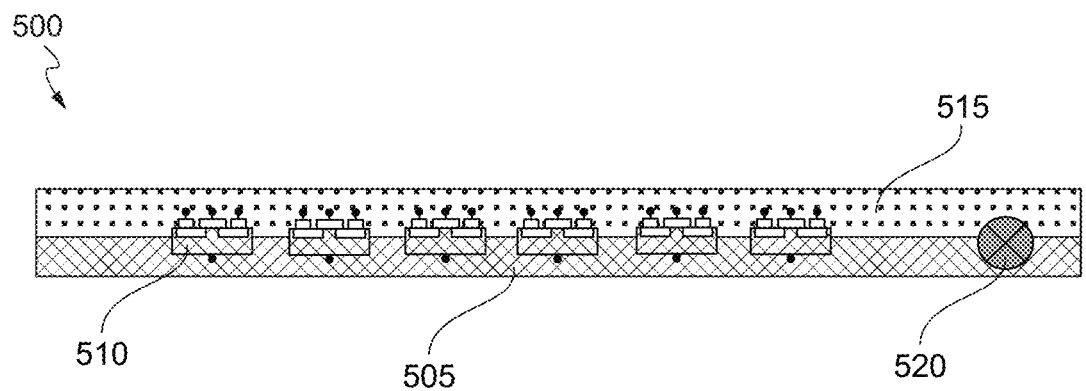
FIGS. 5A-5C show cross-sectional side views illustrating a method of fabricating a digital microfluidic system in accordance with various embodiments.

FIG. 5A shows a control chip 500 comprising a substrate 505 and one or more transistors 510 (e.g., FETs), one or more wiring layers 515, and driving circuitry 520. The substrate 505 may be comprised of but not limited to silicon, germanium, silicon germanium, silicon carbide, and those materials consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y_3+Y4=1$ (1 being the total relative mole quantity). Substrate 505 may additionally or alternatively be comprised of Group II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). The processes to provide, obtain, or fabricate substrate 505, as illustrated and described, are well known in the art and thus, no further description is provided herein.

The processes to provide, obtain, or fabricate the one or more transistors 510 (e.g., FETs), one or more wiring layers 515, and driving circuitry 520, as illustrated and described, are well known in the art (e.g., one or more three dimensional fabrication processes used to form CMOS FET arrays, TFT arrays, or CCD arrays and control systems thereof), and FIG. 4B shows a top plate 400 comprising a substrate 405, a continuous ground electrode 410, and thus, no further description is provided herein. The one or more transistors 510 may include any number and type of transistor such as bipolar junction transistors, FETs, e.g., metal-oxide semiconductor field effect transistors, nanowire transistors, organic electrochemical transistors, single-electron transistors, diffusion transistors, etc. e transistors 510 may be comprised of semiconductor material with at least three terminals (e.g., the drain, source, and gate) for connection to an external circuit such as the driving circuitry. A voltage or current applied to one or more of the transistor's terminals controls the current through one or more other terminals.

Figure 5B:
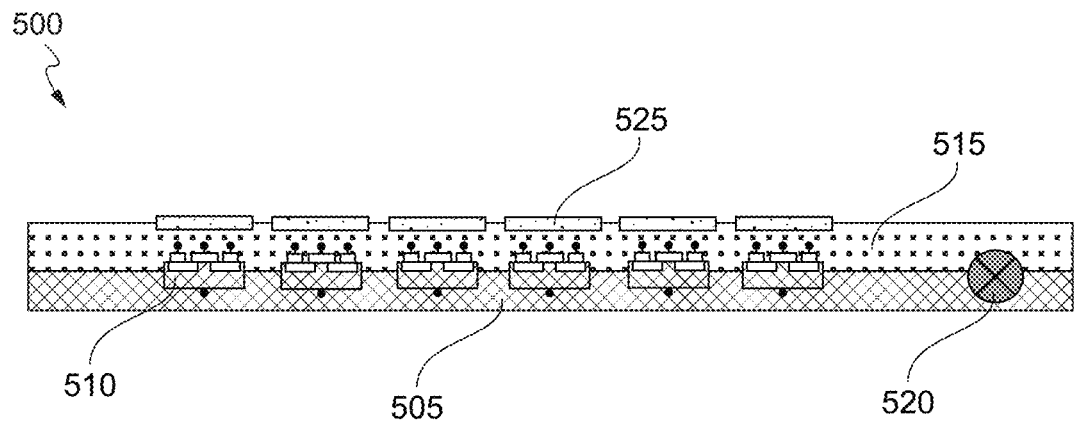
Figure 5C:
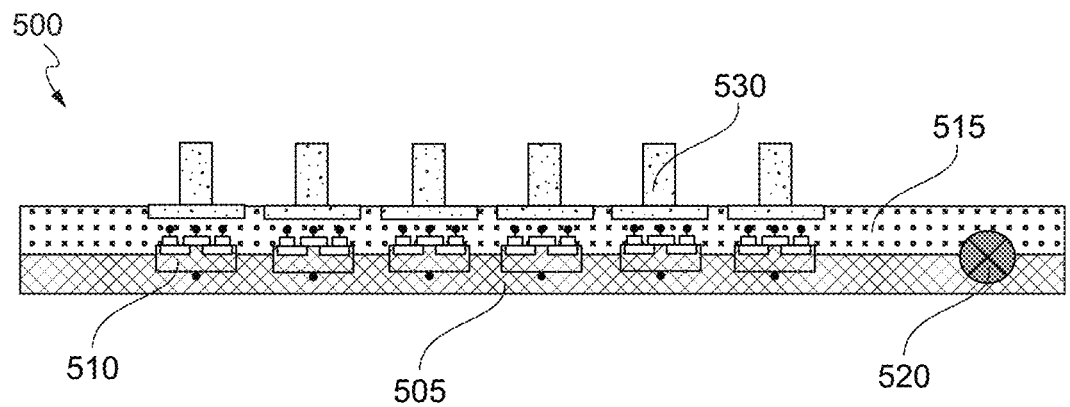

FIG. 5B shows a control chip 500 comprising one or more contacts 525 formed in electrical contact with the one or more transistors 510 (e.g., FETs) on the substrate 505. The one or more contacts 525 can be formed using conventional lithographic, etching, and cleaning processes, known to those of skill in the art. For example, in some embodiments, a trench can be etched into the substrate 505 and a conductive material may be deposited into the trench and on top of the substrate 505. The conductive material may be chromium (Cr), copper (Cu), gold (Au), silver (Ag), titanium (Ti), or platinum (Pt), or alloys thereof such as gold/chromium (Au/Cr), indium tin oxide (ITO) or Titanium/Platinum (Ti/Pt), or graphene, for example. Once the conductive material is deposited, the conductive material may be etched and planarized using conventional processes to form the one or more contacts 525 as shown in FIG. 5B, for example. As shown, in some embodiments, the one or more contacts 525 may be formed in contact with one or more wiring layers 515. In other embodiments, a trench can be etched into the substrate 505 and a conductive material may be deposited into the trench and on top of the substrate 505. The conductive material may be chromium (Cr), copper (Cu), gold (Au), silver (Ag), titanium (Ti), or platinum (Pt), or alloys thereof such as gold/chromium (Au/Cr), indium tin oxide (ITO) or Titanium/Platinum (Ti/Pt), or graphene, for example. Once the conductive material is deposited, the conductive material may be etched and planarized using conventional processes to form the one or more contacts 525 as shown in FIG. 5C, for example. The connection of the one or more contacts 525 to the one or more transistors 510 results in the final product of the control chip 500. In accordance with various aspects discussed herein, the a control chip 500 is intended to be reusable with various types of droplet chips 470 (e.g., having various numbers a electrodes).

IV. Methods For Droplet Manipulation

Figure 6:
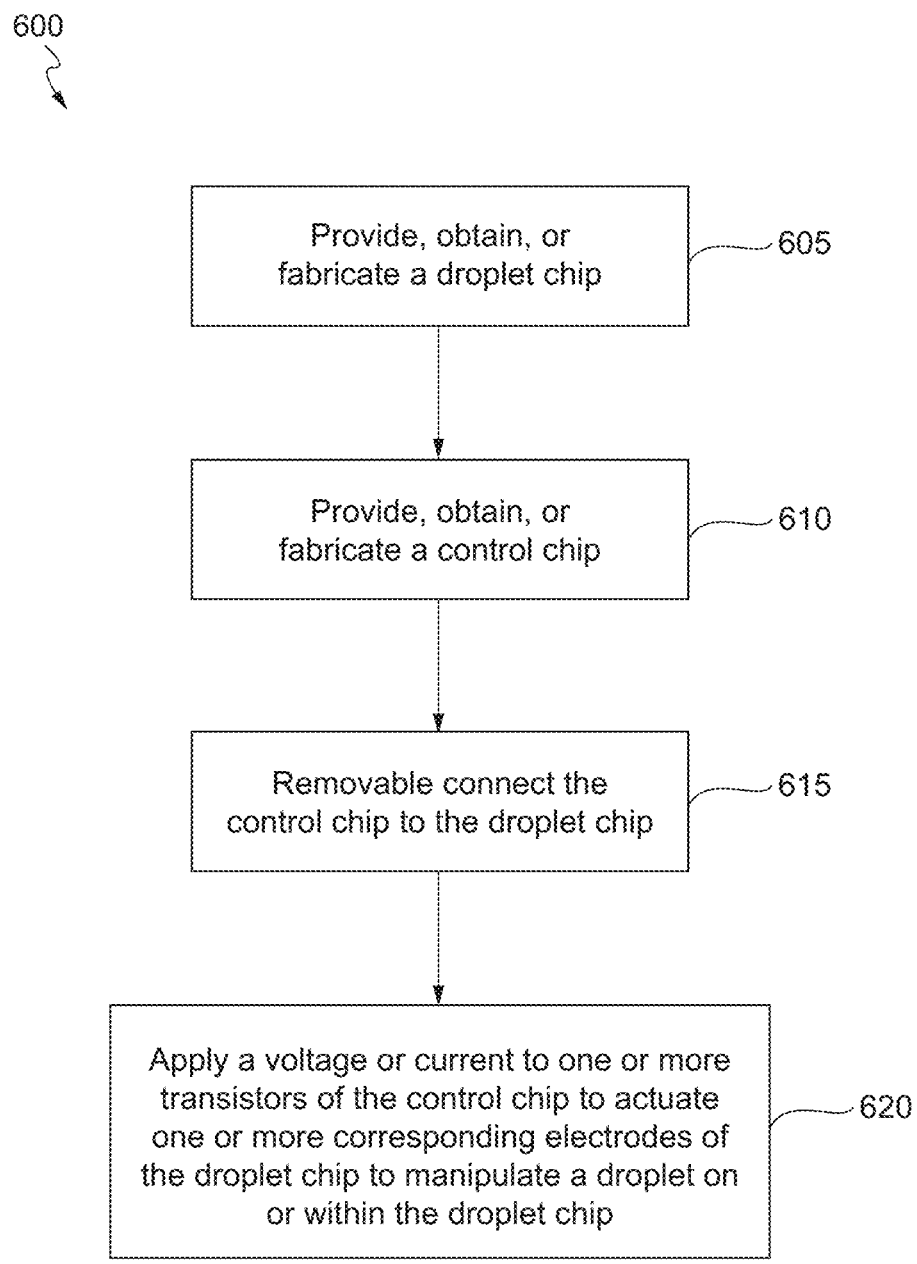
FIG. 6 shows an exemplary flow for droplet manipulation in accordance with various embodiments.

FIG. 6 depicts a simplified flowchart 600 depicting processing performed for droplet manipulation according to embodiments of the present invention. As noted herein, the flowchart of FIG. 6 illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical functions. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combination of blocks in the block diagrams and/or flowchart illustration, can be implemented by special purpose hardware-based systems that perform the specified functions or acts, or combinations of special purpose hardware and computer instructions.

At step 605, a droplet chip is provided, obtained, or fabricated in accordance with various aspects discussed herein. At step 610, a control chip is provided, obtained, or fabricated in accordance with various aspects discussed herein. At step 615, the control chip is removably connected to the droplet chip in accordance with various aspects discussed herein. For example, one or more pins of the control chip may be inserted into one or more corresponding vias of the droplet chip such that the transistors of the control chip are electrical connected respectively to the electrodes of the droplet chip. At step 620 a voltage or current is applied via driving circuitry to one or more of the terminals of one or more transistors in the control chip, which controls the current through one or more other terminals of the one or more transistors. As the voltage or current is applied through the one or more transistors of the control chip, the voltage or current is routed through the substrate of the bottom plate to corresponding one or more electrodes of the droplet chip. The applied voltage or current actuates the corresponding one or more electrodes of the droplet chip and allows changes in wettability of a droplet on or within the droplet chip. In various embodiments, the droplet may be manipulated under wettability differences between actuated and nonactuated electrodes in order to create, transport, cut, and merge the droplet(s). For example, in order to move a droplet, a control voltage may be applied to an electrode adjacent to the droplet, and at the same time, the electrode just under the droplet is deactivated. By varying the electric potential along a linear array of transistors of the control chip and corresponding electrodes of the droplet chip, electrowetting can be used to move droplets along a line of electrodes and through the conduit.

Figure 7:
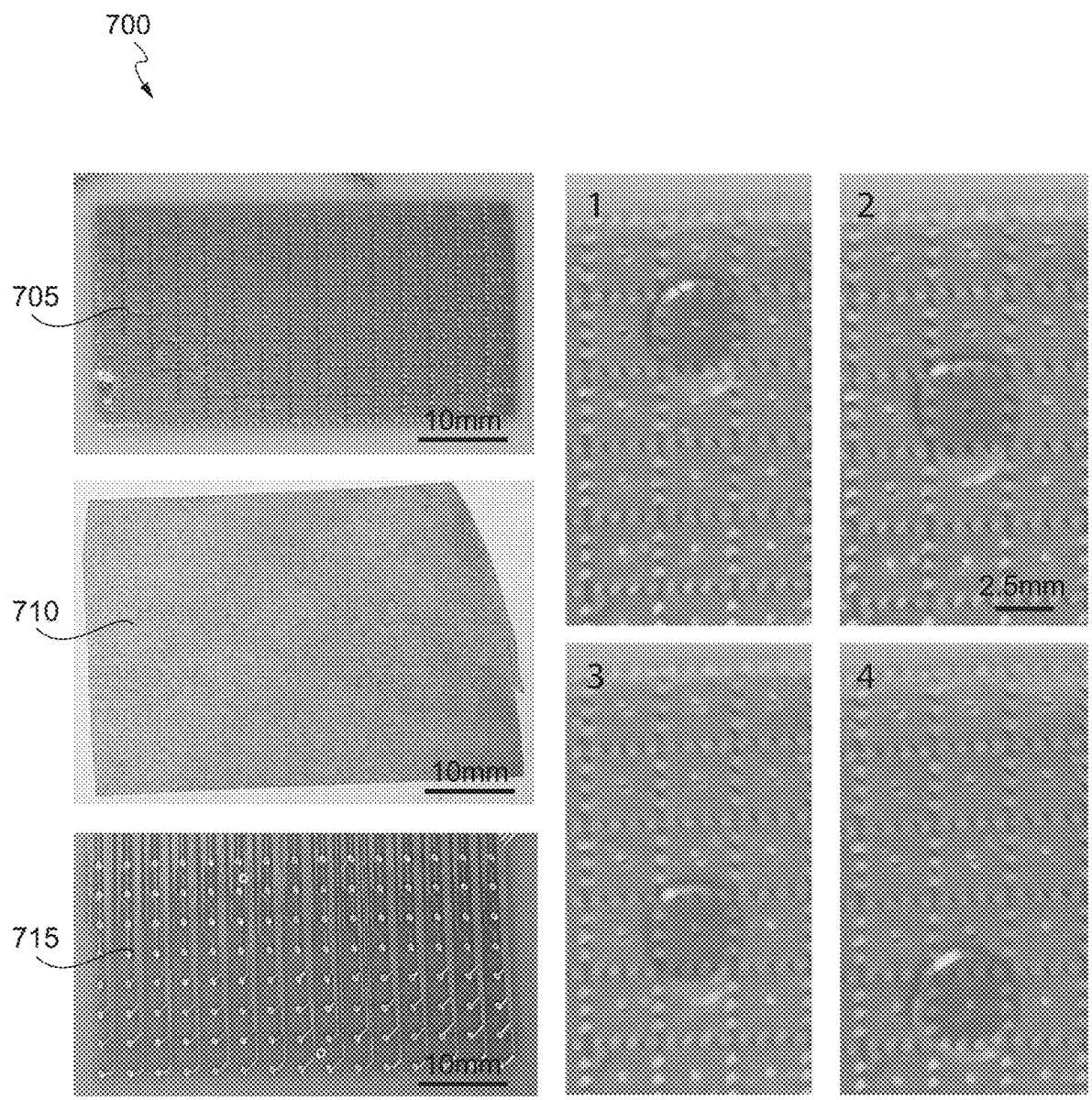
FIG. 7 shows images of a printed circuit board disposable plate (top board) and a printed circuit board control chip (bottom board) in accordance with various embodiments.

FIG. 7 shows images of system 700 comprising a PCB matrix array disposable plate 705 (top board), AF-Type inter-connector 710 (fiber membrane), and a PCB matrix array control chip 715 (bottom board), in accordance with various embodiments. Following stacking and assembly of the three components, a high-voltage was applied to the control chip 715, transmitted through the inter-connector 710 and applied to the disposable plate 705. Assembly was utilized to drive sequential droplet movement across the disposable plate 705 (sequence 1-4). Upon assembly the inter-connector 710 afforded a measured resistance across connected PCBs. Conversely, no electrical resistance was measured when PCBs where connected without the inter-connector 710. Application of an AC voltage to the control chip 715 resulted in transmission of the voltage to the electrodes on the disposable plate 705. The system 700 was employed to drive the actuation of a droplet on the top surface of the disposable plate 705 using row-column addressing of the droplet actuation electrodes.

While the invention has been described in detail, modifications within the spirit and scope of the invention will be readily apparent to the skilled artisan. It should be understood that aspects of the invention and portions of various embodiments and various features recited above and/or in the appended claims may be combined or interchanged either in whole or in part. In the foregoing descriptions of the various embodiments, those embodiments which refer to another embodiment may be appropriately combined with other embodiments as will be appreciated by the skilled artisan. Furthermore, the skilled artisan will appreciate that the foregoing description is by way of example only, and is not intended to limit the invention.

What is claimed is:

1. A digital microfluidic system comprising:
   a droplet chip comprising a first substrate, a plurality of electrodes and a corresponding plurality of conducting vias formed in the first substrate, and a dielectric layer formed over the plurality of electrodes; and
   a control chip comprising a second substrate, a plurality of transistors and corresponding wiring layers formed in the second substrate, and a plurality of contacts formed over the plurality of transistors, wherein the plurality of contacts comprises a plurality of conductive pins,
   wherein each of the plurality of contacts is electrically connected to a terminal of a corresponding transistor of the plurality of transistors, and one or more of the plurality of contacts of the control chip is removably connected to one or more of the plurality of conducting vias of the droplet chip such that one or more of the plurality of transistors of the control chip are electrically connected to one or more of the plurality of electrodes of the droplet chip,
   wherein the plurality of conducting vias are exposed at a bottom surface of the first substrate of the droplet chip,
   wherein each of the plurality of conducting vias is lined with a conductive material but maintains a hole devoid of material through a center of the via and is configured to receive a corresponding conductive pin of the plurality of conductive pins from the control chip, and
   wherein a removable connection between the one or more of the plurality of contacts of the control chip and the conducting vias of the droplet chip is formed at the bottom surface of the first substrate of the droplet chip at which the conducting vias are exposed and a surface of the second substrate on which the plurality of conductive pins of the control chip are formed.

2. The digital microfluidic system of claim 1, wherein:
   the first substrate, the plurality of electrodes and the corresponding plurality of conducting vias, and the dielectric layer form a bottom plate of the droplet chip;
   the droplet chip further includes a top plate comprising a third substrate and a ground electrode formed on the third substrate; and
   the top plate and the bottom plate are arranged in parallel to one another respectively with a distance gap maintained by one or more spacers making up one or more fluidic channels there between.

3. The digital microfluidic system of claim 2, wherein the top plate further comprises a first hydrophobic layer formed on a ground electrode, and the bottom plate further comprises a second hydrophobic layer formed on the dielectric layer.

4. The digital microfluidic system of claim 1, wherein each of the plurality of conducting vias extends from a bottom surface of an electrode to a bottom surface of the first substrate.

5. The digital microfluidic system of claim 1, wherein each of the plurality of transistors includes a source, drain, and gate, and the plurality of transistors are formed in a row-column fashion.

6. The digital microfluidic system of claim 5, wherein each gate of a transistor on a same axis is interconnected to form a row of transistors, and each drain of a transistor on a same axis is interconnected to form a column of transistors.

7. The digital microfluidic system of claim 1, wherein the first substrate is a printed circuit board (PCB), a flexible circuit board, a glass substrate, a silicon substrate, a three dimensional printed substrate, a paper substrate, a polymer substrate, or any combination thereof.

8. The digital microfluidic system of claim 1, wherein the plurality of transistors are comprised of an array of field effect transistors, an array of thin-film transistor devices, or an array of charge-coupled devices, and the second substrate further comprises a logic device or control circuit to provide row-column addressing of the plurality of transistors.

9. A droplet chip comprising:
a top plate comprising a first substrate and a ground electrode formed on the first substrate; and
a bottom plate comprising a second substrate, a plurality of electrodes and a corresponding plurality of conducting vias formed in the second substrate, and a dielectric layer formed over the plurality of electrodes,
wherein each of the plurality of conducting vias is lined with a conductive material but maintains a hole devoid of material through a center of the via and is configured to receive a conductive pin of a plurality of conductive pins from a control chip,
wherein the top plate and the bottom plate are arranged in parallel to one another respectively with a distance gap maintained by one or more spacers making up one or more fluidic channels there between,
wherein each of the plurality of conducting vias extends from a bottom surface of an electrode to a bottom surface of the second substrate, wherein the plurality of conducting vias are exposed at a surface of the second substrate,
wherein each of the plurality of electrodes is configured to manipulate one or more droplets disposed in the one or more fluidic channels in response to an electrical voltage or current applied to at least one of the plurality of conducting vias, and
wherein the electrical voltage or current is applied to the plurality of electrodes through a removable electrical connection between the bottom surface of the second substrate on which the conducting vias are exposed and a surface of the control chip on which corresponding conductive pins are formed.

10. The droplet chip of claim 9, wherein the top plate further comprises a first hydrophobic layer formed on a ground electrode, and the bottom plate further comprises a second hydrophobic layer formed on the dielectric layer.

11. The droplet chip of claim 9, wherein the second substrate is a printed circuit board (PCB), a flexible circuit board, a glass substrate, a silicon substrate, a three dimensional printed substrate, a paper substrate, a polymer substrate, or any combination thereof.

12. A method of droplet manipulation with a digital microfluidic system, the method comprising:
obtaining a droplet chip comprising a first substrate, a plurality of electrodes and corresponding plurality of conducting vias formed in the substrate, and a dielectric layer formed over the plurality of electrodes;
obtaining a control chip comprising a second substrate, a plurality of transistors and corresponding wiring layers formed in the second substrate, and a plurality of contacts formed over the plurality of transistors wherein the plurality of contacts comprises a plurality of conductive pins, wherein the plurality of conducting vias are exposed at a bottom surface of the first substrate of the droplet chip, and wherein each of the plurality of conducting vias is lined with a conductive material but maintain a hole devoid of material through a center of the via and is configured to receive a corresponding conductive pin of the plurality of conductive pins from the control chip;
removably connecting the control chip with the droplet chip at the bottom surface of the first substrate of the droplet chip at which the conducting vias are exposed and a surface of the second substrate on which the plurality of conductive pins of the control chip are formed, wherein each of the plurality of contacts is electrically connected to a terminal of a corresponding transistor of the plurality of transistors, and one or more of the plurality of contacts is removably connected to one or more of the plurality of conducting vias such that one or more of the plurality of transistors are electrically connected to one or more of the plurality of electrodes; and
applying an electrical voltage or current to one or more of the plurality of transistors to actuate one or more corresponding electrodes of the plurality of electrodes, which allows changes in wettability of a droplet on or within the droplet chip.

13. The method of claim 12, wherein:
the first substrate, the plurality of electrodes and the corresponding plurality of conducting vias, and the dielectric layer form a bottom plate of the droplet chip;
the droplet chip further includes a top plate comprising a third substrate and a ground electrode formed on the third substrate;
the top plate and the bottom plate are arranged in parallel to one another respectively with a distance gap maintained by one or more spacers making up one or more fluidic channels there between; and
the droplet is within the one or more fluidic channels.

14. The method of claim 12, wherein each of the plurality of transistors includes a source, drain, and gate, and the plurality of transistors are formed in a row-column fashion.

15. The method of claim 14, wherein:
each gate of a transistor on a same axis is interconnected to form a row of transistors;
each drain of a transistor on a same axis is interconnected to form a column of transistors; and
applying an electrical voltage or current to one or more of the plurality of transistors includes applying the electrical voltage or current to a terminal of the one or more of the plurality of transistors.

16. The method of claim 12, wherein:
the first substrate is a printed circuit board (PCB), a flexible circuit board, a glass substrate, a silicon substrate, a three dimensional printed substrate, a paper substrate, or any combination thereof;
the plurality of transistors are comprised of an array of field effect transistors, an array of thin-film transistor devices, or an array of charge-coupled devices; and
the second substrate further comprises a logic device or control circuit to provide row-column addressing of the plurality of transistors.

* * * * *